United States Patent
Laaksonen et al.

(10) Patent No.: US 8,855,715 B2
(45) Date of Patent: Oct. 7, 2014

(54) APPARATUS AND METHOD FOR A REMOVABLE MEMORY MODULE

(75) Inventors: Heikki Antero Laaksonen, Espoo (FI); Timo Juha Hanninen, Tampere (FI); John Samuels, Lancashire (GB)

(73) Assignee: Nokia Corporation, Espoo (FI)

( * ) Notice: Subject to any disclaimer, the term of this patent is extended or adjusted under 35 U.S.C. 154(b) by 615 days.

(21) Appl. No.: 13/045,891

(22) Filed: Mar. 11, 2011

(65) Prior Publication Data

US 2012/0233402 A1 Sep. 13, 2012

(51) Int. Cl.
*H04B 1/38* (2006.01)
*H01R 24/00* (2011.01)
*H01R 33/00* (2006.01)
*H01R 13/62* (2006.01)
*G06K 7/06* (2006.01)
*G06K 19/06* (2006.01)
*H04M 1/02* (2006.01)

(52) U.S. Cl.
CPC ............ *H04M 1/0274* (2013.01); *H04B 1/3816* (2013.01); *H04M 1/0214* (2013.01)
USPC ............ 455/558; 439/630; 439/631; 439/660; 439/329; 235/441; 235/492

(58) Field of Classification Search
CPC .................................................... G06K 7/0021
USPC .................. 455/558; 439/630, 631, 660, 329; 235/441, 492
See application file for complete search history.

(56) References Cited

U.S. PATENT DOCUMENTS

| | | | |
|---|---|---|---|
| 5,831,256 A | 11/1998 | De Larminat et al. | |
| 5,907,814 A | 5/1999 | Jubert | |
| 6,068,186 A | 5/2000 | Jubert | |
| 6,174,188 B1 * | 1/2001 | Martucci | 439/326 |
| 7,526,625 B2 * | 4/2009 | Ebara et al. | 711/163 |
| 7,988,454 B1 * | 8/2011 | Liu | 439/38 |
| 2002/0023963 A1 * | 2/2002 | Luu | 235/492 |
| 2002/0055291 A1 | 5/2002 | Maiterth et al. | 439/326 |
| 2007/0099453 A1 * | 5/2007 | Park | 439/103 |
| 2010/0025480 A1 | 2/2010 | Nishizawa et al. | |

FOREIGN PATENT DOCUMENTS

| | | |
|---|---|---|
| CN | 201252620 Y | 6/2009 |
| CN | 101632331 A | 1/2010 |
| JP | 2003132976 A | 5/2003 |
| WO | 2007/114591 A1 | 10/2007 |

OTHER PUBLICATIONS

"Smart Cards; UICC—Terminal interface; Physical and logical characteristics (Release 9)", ETSI TS 102 221, v9.0.0, Feb. 2010, pp. 1-175.

* cited by examiner

*Primary Examiner* — Christopher M Brandt
*Assistant Examiner* — Muthuswamy Manoharan
(74) *Attorney, Agent, or Firm* — Harrington & Smith

(57) ABSTRACT

In accordance with an example embodiment of the present invention, an apparatus is provided, comprising: a first part configured to receive a first and second removable memory module, a second part coupled with the first part with a hinge, and conductive terminals configured to contact the first removable memory module in a first closed position and the second removable memory module in a second closed position.

20 Claims, 8 Drawing Sheets

APPARATUS AND METHOD FOR A REMOVABLE MEMORY MODULE

TECHNICAL FIELD

The present application relates generally to an apparatus and method for a removable module.

BACKGROUND

Many electronic devices include removable memory modules such as universal integrated circuit cards (UICC), and memory cards. UICCs are also commonly referred to as subscriber identity modules (SIM). Devices may be built to accommodate more than one removable memory module. For example, mobile phones capable of accommodating two UICCs are increasingly popular. The UICCs may represent different card formats. Users need to access the UICCs, and they need to be able to select which UICC is to be used for communication.

SUMMARY

Various aspects of examples of the invention are set out in the claims.

According to a first aspect of the present invention, an apparatus is provided, comprising: a first part configured to receive a first and second removable memory module, a second part coupled with the first part with a hinge, and conductive terminals configured to contact the first removable memory module in a first closed position and the second removable memory module in a second closed position.

According to a second aspect of the present invention, a method is provided, comprising: receiving a first and second removable memory module in a first part, rotating the first part in relation to a second part, and moving the first removable memory module into contact with conductive terminals in a first closed position.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

An example embodiment of the present invention and its potential advantages are understood by referring to FIGS. 1 through 9 of the drawings.

Figure 1:
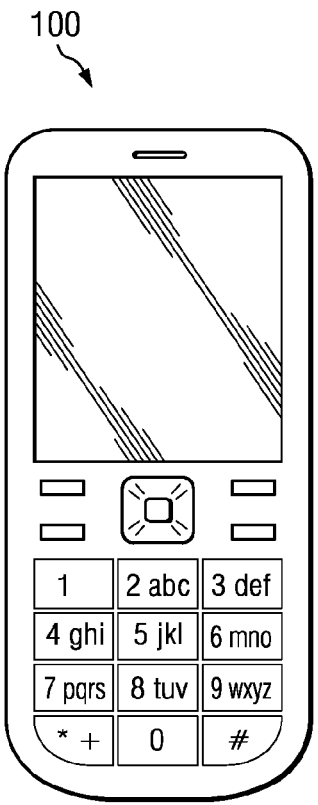
FIG. 1 is a diagram illustrating an electronic device, according to an example embodiment of the invention.

FIG. 1 is a diagram illustrating an electronic device 100, according to an example embodiment of the invention. The electronic device 100 is a mobile telephone, portable computer, multimedia device, navigation device, gaming device, electronic document reading device, remote alarm device, or any other device configured to receive a removable memory module such as a universal integrated circuit card (UICC).

Figure 2:
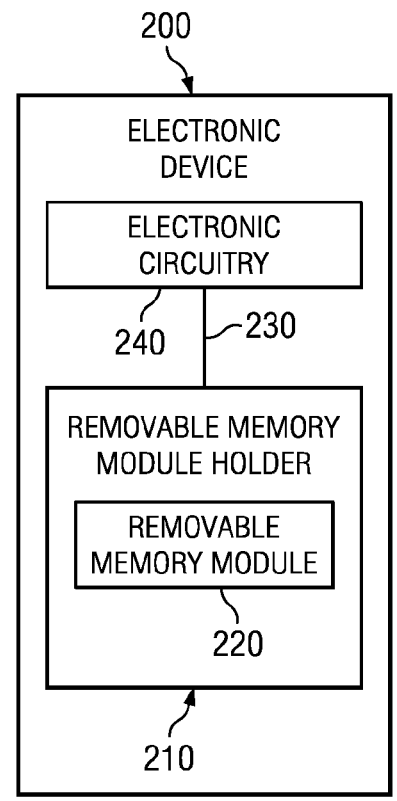
FIG. 2 is a block diagram illustrating an electronic device comprising a removable memory module holder, according to an example embodiment of the invention.

FIG. 2 is a block diagram illustrating an electronic device 200 comprising a removable memory module holder 210, according to an example embodiment of the invention. The removable memory module holder 210 is configured to receive a removable memory module 220. The removable memory module holder 210 may be configured to receive a plurality of removable memory modules 220, which may be of different types. In an embodiment, the removable memory module 220 is a universal integrated circuit card (UICC). However, the removable memory module may be a memory card or any other type of removable unit without departing from the spirit of the invention. The removable memory module 210 holder is configured to connect the removable memory module 220 mechanically to the electronic device 200. The removable memory module holder 210 is configured to provide an electrical connection 230 between the removable memory module 220 and electronic circuitry 240 comprised in the electronic device 200.

Figure 3A:
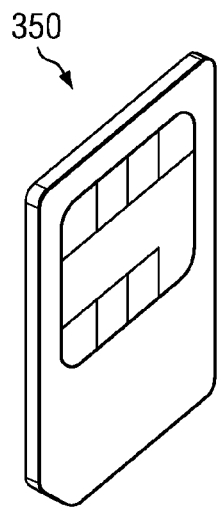
FIG. 3*a* is a diagram illustrating a Plug-in UICC, according to an example embodiment of the invention.

FIG. 3a is a diagram illustrating a Plug-in UICC 350, according to an example embodiment of the invention. The Plug-in UICC 350 is a removable memory module configured to contain subscriber identity information. The Plug-in UICC 350 is a universal integrated circuit card (UICC) according to a standard of the International Organization for Standardization/International Electrotechnical Commission (ISO/IEC) 7810:2003, ID-000.

Figure 3B:
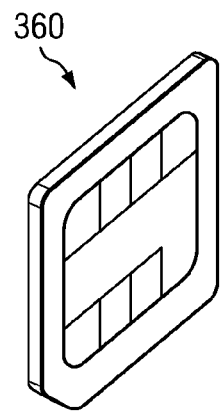
FIG. 3*b* is a diagram illustrating a Mini-UICC, according to an example embodiment of the invention.

FIG. 3b is a diagram illustrating a Mini-UICC 360, according to an example embodiment of the invention. The Mini-UICC 360 is a removable memory module configured to contain subscriber identity information. The Mini-UICC 360 is a universal integrated circuit card (UICC) according to a technical specification of the European Telecommunications Standards Institute (ETSI) TS 102 221 V9.0.0, Mini-UICC.

Figure 4A:
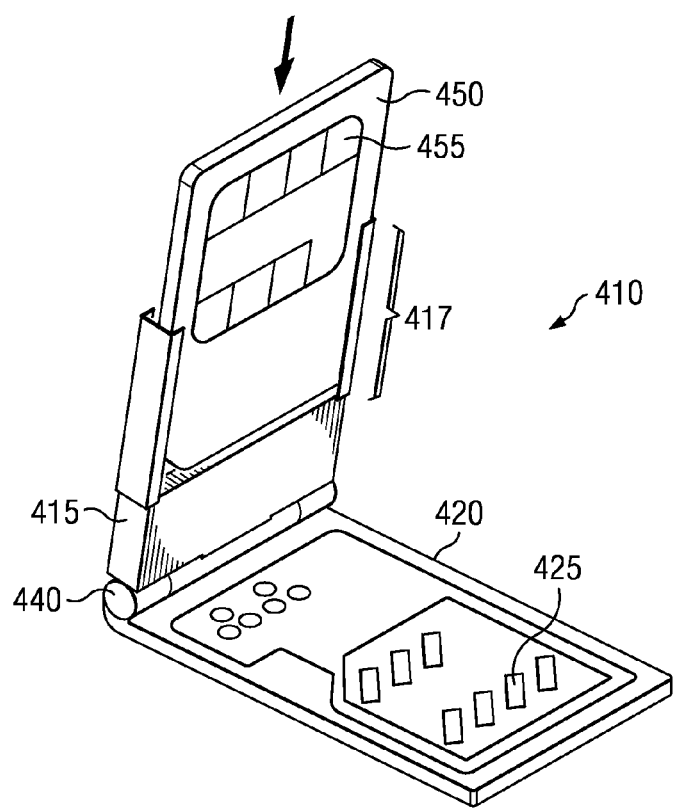
FIG. 4*a* is a diagram illustrating a perspective view of a first open position of a removable memory module holder comprising a first part and a second part, according to an example embodiment of the invention.

FIG. 4a is a diagram illustrating a perspective view of a first open position of a removable memory module holder 410 comprising a first part 415 and a second part 420, according to an example embodiment of the invention. The first part 415 and the second part 420 are movably connected with a hinge 440. In an embodiment, the first part 415 comprises a holder portion 417 configured to receive a Plug-in UICC 450 comprising first electrical contacts 455. The second part 420 comprises conductive terminals 425.

Figure 4B:
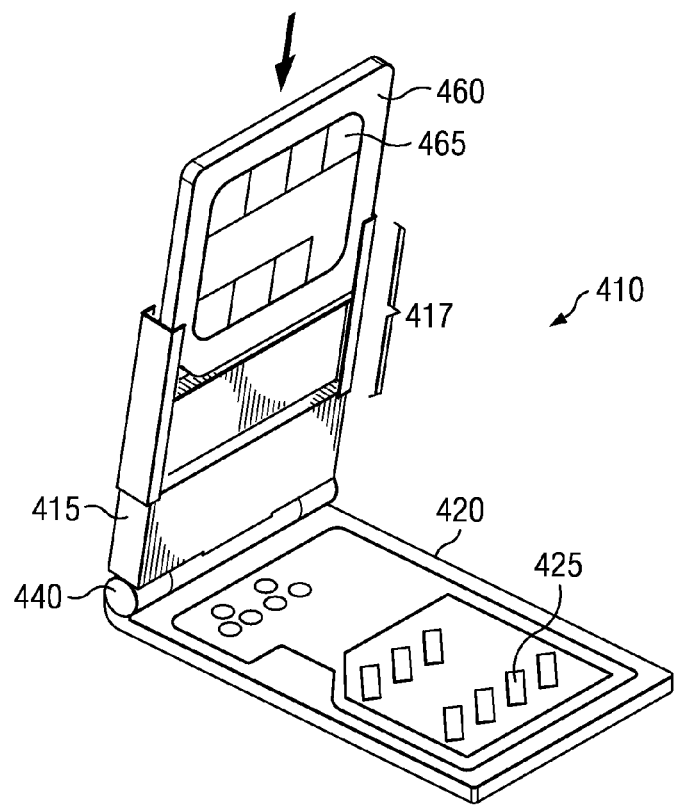
FIG. 4*b* is a diagram illustrating a perspective view of a second open position of a removable memory module holder comprising a first part and a second part, according to an example embodiment of the invention.

FIG. 4b is a diagram illustrating a perspective view of a second open position of a removable memory module holder 410 of FIG. 4a comprising a first part 415 and a second part 420, according to an example embodiment of the invention. The first part 415 and the second part 420 are movably connected with a hinge 440. In an embodiment, the first part 415 comprises a holder portion 417 configured to receive a Mini-UICC 460 comprising second electrical contacts 465. The second part 420 comprises conductive terminals 425.

Figure 4C:
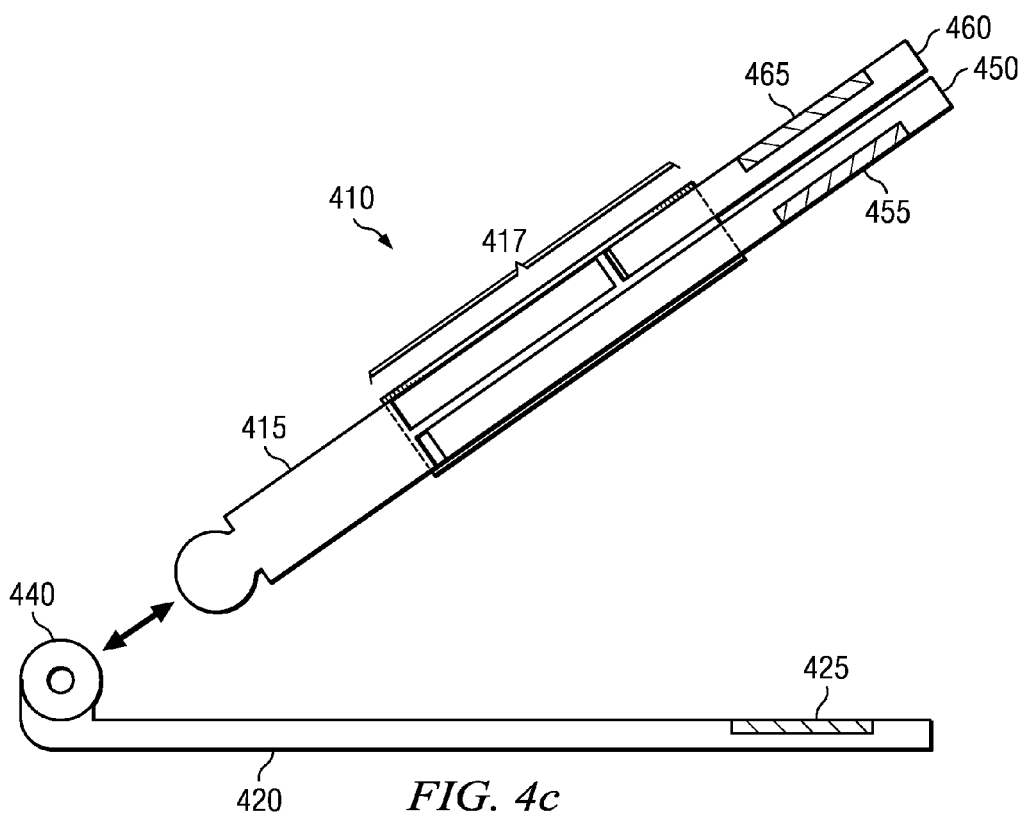
FIG. 4*c* is a diagram illustrating a cross-sectional view of a detached state of a removable memory module holder, according to an example embodiment of the invention.

FIG. 4c is a diagram illustrating a cross-sectional view of a detached state of a removable memory module holder 410, according to an example embodiment of the invention. The removable memory module holder of FIG. 4c is similar to the removable memory module holder of FIGS. 4a and 4b, having similar elements as described previously in connection with FIGS. 4a and 4b. Reference is now made to FIGS. 4a-c.

In an embodiment, the holder portion 417 is configured to receive the Plug-in UICC 450 and the Mini-UICC 460 in a back-to-back configuration. The Plug-in UICC 450 and the Mini-UICC 460 may be received in the holder portion 417 in such a way that their major surfaces are facing each other, and the first electrical contacts 455 and the second electrical contacts 465 are facing away from each other.

In the first open position of FIG. 4a, the second open position of FIG. 4b, and the detached state of FIG. 3c, the conductive terminals 425 are not in contact with the first electrical contacts 455 or the second electrical contacts 465. In the first open position and the second open position, the holder portion 417 may be accessible for a user in such a way that the user can, for example, remove the Plug-in UICC 450 or the Mini-UICC 460 from the holder portion 417, or insert the Plug-in UICC 450 or the Mini-UICC 460 into a vacant place in the holder portion 417.

The first part 415 is configured to be detachable from the second part 420 in such a way that the removable memory module holder 410 can be transformed between the first open position and the second open position. In an embodiment, the hinge 440 is a snap hinge or any other type of hinge in which one portion of the hinge 440 can be easily separated from another portion. In an embodiment, a user can detach the first part 415 from the second part 420 by pulling the first part 415 in a direction generally away from the hinge 440. When the first part 415 and the second part 420 are in a detached state, the user can rotate the first part 415 through an angle of substantially 180° and reconnect it with the second part 420 by pushing the first part 415 toward the second part 420. The action of detaching, rotating and reconnecting may correspond to selecting either the Plug-in UICC 450 or the Mini-UICC 460 for use.

Figure 4D:
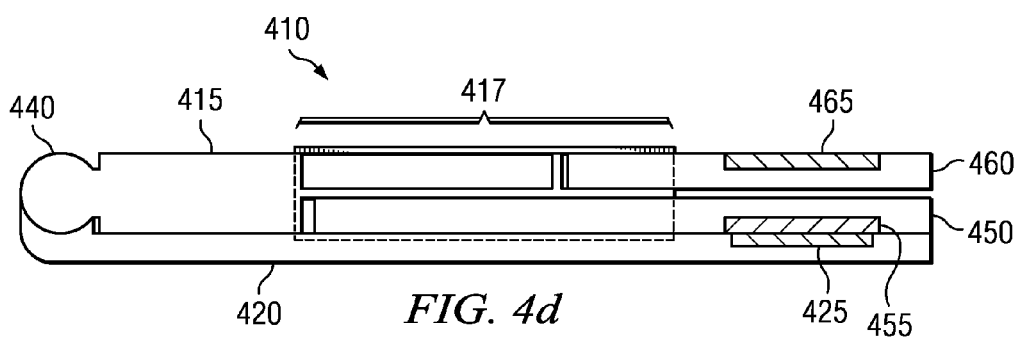
FIG. 4*d* is a diagram illustrating a cross-sectional view of a first closed position of a removable memory module holder comprising a first part and second part, according to an example embodiment of the invention.

FIG. 4d is a diagram illustrating a cross-sectional view of a first closed position of a removable memory module holder 410 of FIG. 4a-4c comprising a first part 415 of FIG. 4a or 4b and a second part 420 of FIG. 4a-4c, according to an example embodiment of the invention. The removable memory module holder 410 comprises a holder portion 417 of FIG. 4a-4c, and a hinge 440 of FIG. 4a-4c. The first closed position is a use position of the Plug-in UICC 450 of FIG. 4a and a storage position of the Mini-UICC 460 of FIG. 4b. In the first closed position, the first electrical contacts 455 of FIG. 4a are facing and in contact with conductive terminals 425 of FIG. 4a-4c, and the second electrical contacts 465 of FIG. 4b are facing away and not in contact with the conductive terminals 425. A user can transform the removable memory module holder 410 from the first open position of FIG. 4a to the first closed position by rotating the first part 415 about the hinge 440 until the first electrical contacts 455 come into contact with the conductive terminals 425.

Figure 4E:
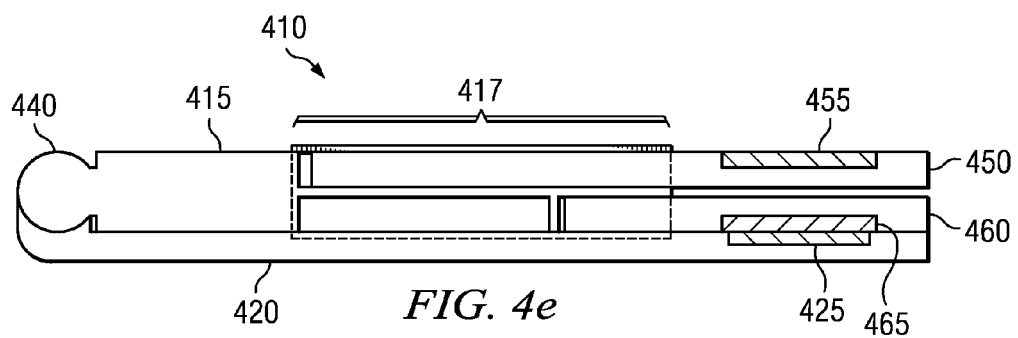
FIG. 4*e* is a diagram illustrating a cross-sectional view of a second closed position of a removable memory module holder comprising a first part and a second part, according to an example embodiment of the invention.

FIG. 4e is a diagram illustrating a cross-sectional view of a second closed position of a removable memory module holder 410 of FIG. 4a-4d comprising a first part 415 of FIG. 4a-4d and second part 420 FIG. 4a-4d, according to an example embodiment of the invention. The removable memory module holder 410 comprises a holder portion 417 of FIG. 4a-4d, and a hinge 440 of FIG. 4a-4d. The second closed position is a storage position of the Plug-in UICC 450 of FIG. 4a and a use position of the Mini-UICC 460 of FIG. 4b. In the second closed position, the second electrical contacts 465 of FIG. 4b are facing and in contact with the conductive terminals 425 of FIGS. 4a and 4b, and the first electrical contacts 455 of FIG. 4b are facing away and not in contact with the conductive terminals 425. A user can transform the removable memory module holder 410 from the second open position of FIG. 4b to the second closed position by rotating the first part 415 about the hinge 440 until the second electrical contacts 465 come into contact with the conductive terminals 425.

A removable memory module holder 410 as described in FIGS. 4a-4e may be implemented in various ways without departing from the spirit of the invention. By way of example, two or more detachable parts generally similar to the first part 415 may be provided. In an embodiment, a first detachable part is provided with a holder portion for a Plug-in UICC, and a second detachable part is provided with a holder portion for a Mini-UICC. A user can connect either the first or the second detachable part to an electronic device, depending on which UICC the user wants to use. A storage case may be provided for stowing the part which is not in use.

A removable memory module holder 410 as described in FIGS. 4a-4e may be implemented by providing the holder section 417 as a separate rotable part connected with a hinge to the first part 415. The holder section 417 implemented as a separate rotable part allows a user to transform the removable memory module holder 410 between the first open position of FIG. 4d and the second open position of FIG. 4e without detaching the first part 415 from the second part 420.

Figure 5A:
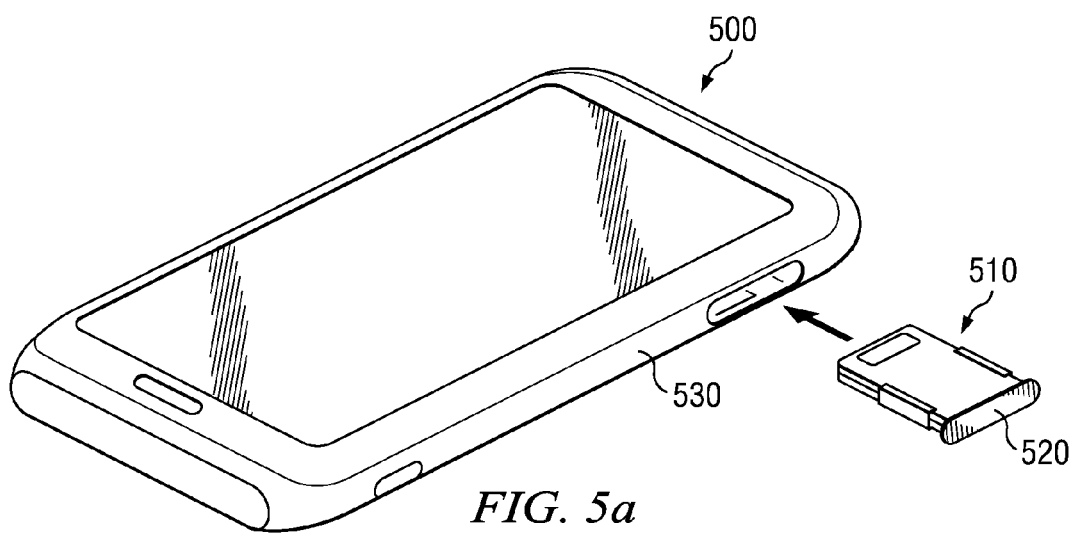
FIG. 5*a* is a diagram illustrating a perspective view of an open position of a removable memory module holder comprising a cover part, according to an example embodiment of the invention.

FIG. 5a is a diagram illustrating a perspective view of an open position of a removable memory module holder 510 comprising a cover part 520, according to an example embodiment of the invention. The removable memory module holder 510 is configured to be connectable with an electronic device 500 comprising an external cover 530. In the open position shown in FIG. 5a, the removable memory module holder 510 is in a detached state in which the removable memory module holder 510 is not connected with the electronic device 500.

Figure 5B:
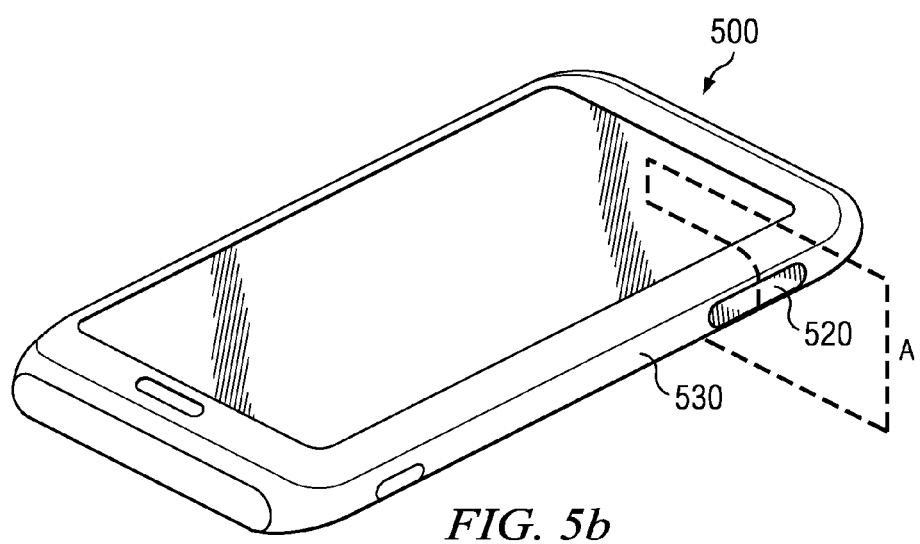
FIG. 5*b* is a diagram illustrating a perspective view of a closed position of a removable memory module holder comprising a cover part, according to an example embodiment of the invention.

FIG. 5b is a diagram illustrating a perspective view of a closed position of a removable memory module holder 510 of FIG. 5a comprising a cover part 520 of FIG. 5a, according to an example embodiment of the invention. The cover part 520 is configured to form a portion of an external cover 530 of FIG. 5a in an electronic device 500 of FIG. 5a. In the closed position shown in FIG. 5b, the removable memory module holder 510 is connected with the electronic device 530 in such a way that the cover part 520 is substantially aligned with the external cover 530. In an embodiment, the removable memory module holder 510 is placed inside the electronic device 500 in such a way that only the cover part 520 remains visible from the outside in the view shown in FIG. 5a. A cross-section plane A is indicated for FIGS. 5c and 5d.

Figure 5C:
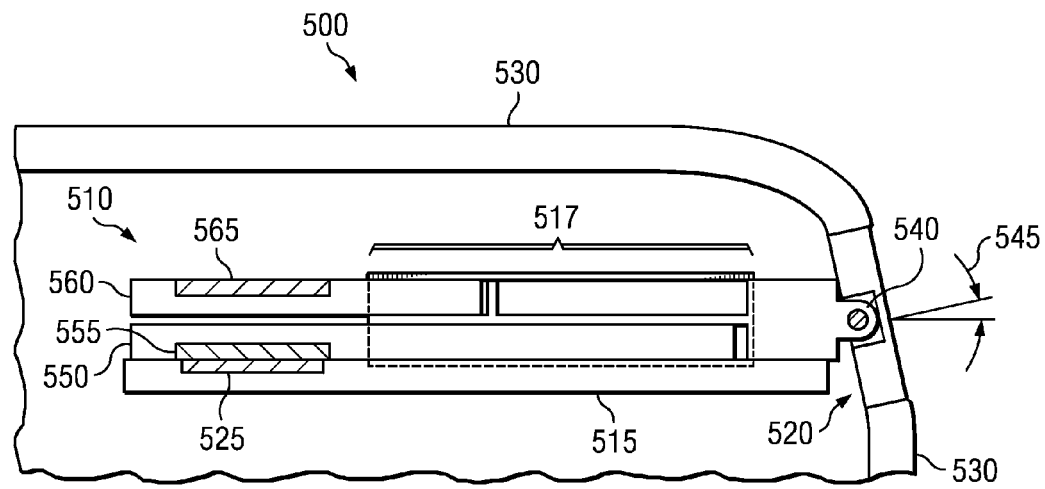
FIG. 5*c* is a diagram illustrating a cross-sectional view of a first closed position of a removable memory module holder comprising a cover part, according to an example embodiment of the invention.

FIG. 5c is a diagram illustrating a cross-sectional view of a first closed position of a removable memory module holder 510 of FIG. 5a comprising a cover part 520 of FIG. 5a, according to an example embodiment of the invention. The removable memory module holder 510 may be provided in an electronic device 500 of FIGS. 5a and 5b, the electronic device 500 comprising an external cover 530 of FIGS. 5a and 5b. The removable memory module holder 510 comprises a first part 515 comprising a holder portion 517 and conductive terminals 525. The first part 515 and the cover part 520 are connected with a hinge 540. In an embodiment, the cover part 520 is connected with the first part 515 in such a way the cover part 520 forms an angle 545 with the first part 515. The angle 545 is suitably selected in such a way that the cover part 520 can be aligned with the external cover 530.

The first closed position is a use position of a Plug-in UICC 550 comprising first electrical contacts 555, and a storage position of a Mini-UICC 560 comprising second electrical contacts 565. In the first closed position, the first electrical contacts 555 are facing and in contact with the conductive terminals 525 and the second electrical contacts 565 are facing away and not in contact with the conductive terminals 525.

Figure 5D:
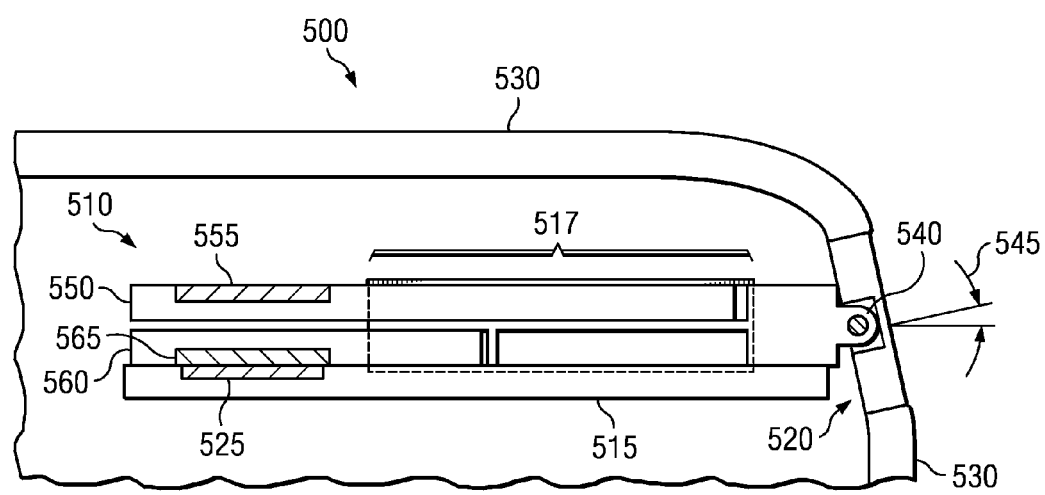
FIG. 5*d* is a diagram illustrating a cross-sectional view of a second closed position of a removable memory module holder comprising a cover part, according to an example embodiment of the invention.

FIG. 5d is a diagram illustrating a cross-sectional view of a second closed position of a removable memory module holder 510 of FIGS. 5a and 5c, comprising a cover part 520 of FIGS. 5a, 5b, and 5c, according to an example embodiment of the invention. The removable memory module holder 510 may be provided in an electronic device 500 of FIGS. 5a and 5b, the electronic device 500 comprising an external cover 530 of FIGS. 5a and 5b. The removable memory module holder 510 comprises a first part 515 of FIG. 5c comprising a holder portion 517 of FIG. 5c and conductive terminals 525 of FIG. 5c. The first part 515 and the cover part 520 are connected with a hinge 540 of FIG. 5c. In an embodiment, the cover part 520 is connected with the first part 515 in such a way the cover part 520 forms an angle 545 with the first part 515. The angle 545 is suitably selected in such a way that the cover part 520 can be aligned with the external cover 530. The second closed position is a use position of a Mini-UICC 560 of FIG. 5c comprising second electrical contacts 565 of FIG. 5c, and a storage position of a Plug-in UICC 550 comprising first electrical contacts 555 of FIG. 5c. In the second closed position, the second electrical contacts 565 are facing and in contact with the conductive terminals 525 and the first electrical contacts 555 are facing away and not in contact with the conductive terminals 525.

Reference is now made to FIGS. 5a-5d. In the open position of FIG. 5a, the conductive terminals 525 are not in contact with the first electrical contacts 555 or the second electrical contacts 565. In the open position, the Plug-in UICC 550 and the Mini-UICC 560 may be accessible for a user in such a way that the user can, for example, remove the Plug-in UICC 550 or the Mini-UICC 560 from the holder portion 517, or insert the Plug-in UICC 550 or the Mini-UICC 560 into a vacant place in the holder portion 517.

The closed position illustrated in FIG. 5b may be either the first closed position of FIG. 5c or the second closed position of FIG. 5b. In order to move the removable memory module holder from the closed position of FIG. 5b to the open position of FIG. 5a, a user may actuate an opening mechanism, such as a push latch. In an embodiment, an opening mechanism with an opening button may be provided. After pulling the removable memory module holder 510 out of the electronic device 500, the user can rotate it through an angle of substantially 180° and insert it back into the electronic device 510. This action may correspond to selecting either the Plug-in UICC 550 or the Mini-UICC 560 for use.

The cover 520 part is configured to be rotable in relation to the first part 515 in such a way that when a user transforms the removable memory module holder 510 from the first position to the second position, or from the second position to the first position, the user can rotate the cover part 520 though an angle of substantially 180° in order to align the cover part 520 with the external cover 530.

A removable memory module holder as described in FIGS. 5a-5d may be implemented in various ways without departing from the spirit of the invention. By way of example, two or more removable memory module holders generally similar to the removable memory module holder 510 may be provided. In an embodiment, a first removable memory module holder is provided with a holder portion for a Plug-in UICC, and a second removable memory module holder is provided with a holder portion for a Mini-UICC. A user can connect either the first or the second detachable part to an electronic device, depending on which UICC the user wants to use. A storage case may be provided for stowing the removable memory module holder which is not in use.

Figure 6A:
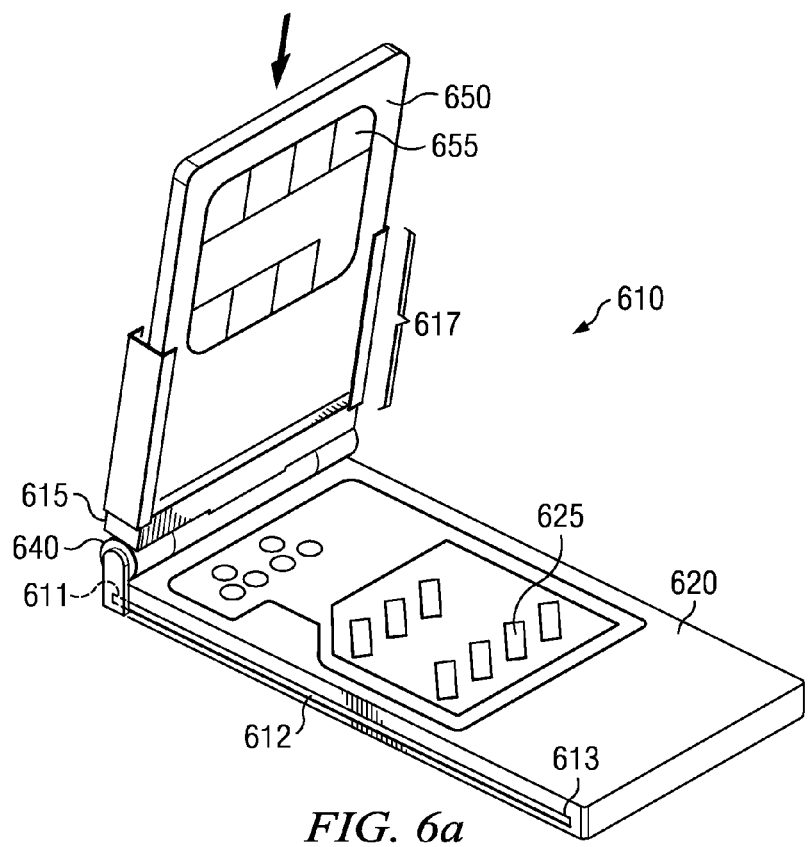
FIG. 6*a* is a diagram illustrating a perspective view of a first open position of a removable memory module holder comprising a slide rail, according to an example embodiment of the invention.

FIG. 6a is a diagram illustrating a perspective view of a first open position of a removable memory module holder 610 comprising a slide rail 612, according to an example embodiment of the invention. The removable memory module holder 610 comprises a first part 615 and a second part 620. In an embodiment, the first part 615 comprises a holder portion 617 configured to receive a Plug-in UICC 650 comprising first electrical contacts 655. The second part 620 comprises conductive terminals 625. The first part 615 and the second part 620 are movably connected with a hinge 640. In an embodiment, the hinge 640 is configured to be movable along the slide rail 612. The slide rail 612 has a first end 611 and a second end 613. In the first open position of FIG. 6a, the hinge 640 is at or proximate to the first end 611.

Figure 6B:
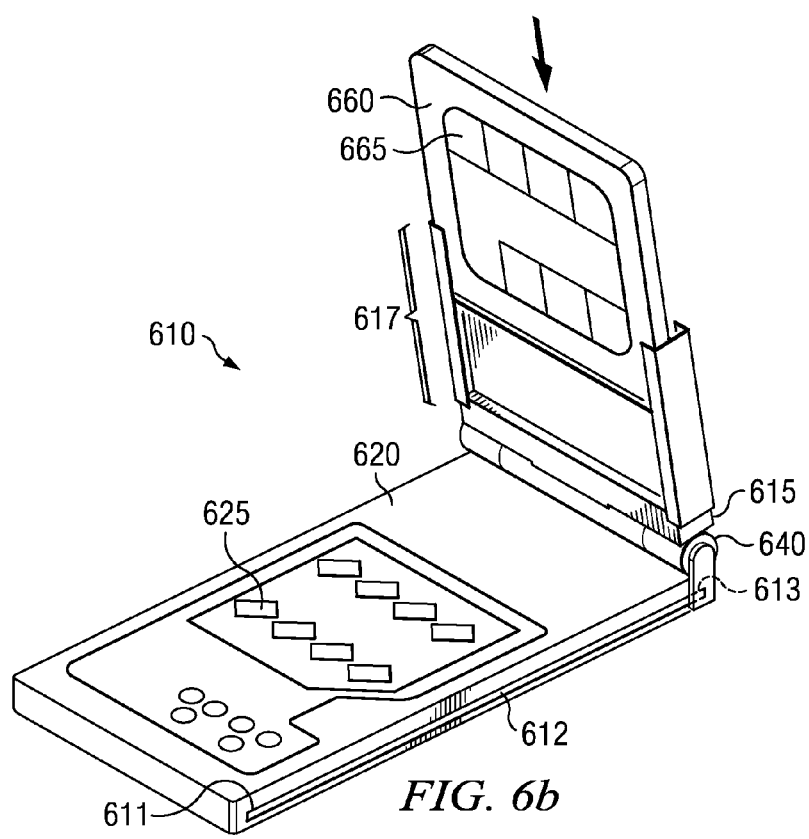
FIG. 6*b* is a diagram illustrating a perspective view of a second open position of a removable memory module holder comprising a slide rail, according to an example embodiment of the invention.

FIG. 6b is a diagram illustrating a perspective view of a second open position of a removable memory module holder 610 of FIG. 6a comprising a slide rail 612 of FIG. 6a, according to an example embodiment of the invention. The removable memory module holder 610 comprises a first part 615 of FIG. 6a and a second part 620 of FIG. 6a. The second part 620 comprises conductive terminals 625 of FIG. 6a. The first part 615 and the second part 620 are movably connected with a hinge 640 of FIG. 6a. The slide rail 612 has a first end 611 of FIG. 6a and a second end 613 of FIG. 6a. In the second open position of FIG. 6b, the hinge 640 is at or proximate to the second end 612. In an embodiment, the first part 615 comprises a holder portion 617 of FIG. 6a configured to receive a Mini-UICC 660 comprising second electrical contacts 665.

Reference is now made both to FIGS. 6a and 6b. In an embodiment, the holder portion 617 is configured to receive the Plug-in UICC 650 and the Mini-UICC 660 in a back-to-back configuration. The Plug-in UICC 650 and the Mini-UICC 660 may be received in the holder portion 617 in such a way that their major surfaces are facing each other, and the first electrical contacts 655 and the second electrical contacts 665 are facing away from each other.

In the first open position of FIG. 6a and the second open position of FIG. 6b, the conductive terminals 625 are not in contact with the first electrical contacts 655 or the second electrical contacts 665. In the first open position and the second open position, the holder portion 617 may be accessible for a user in such a way that the user can, for example, remove the Plug-in UICC 650 or the Mini-UICC 660 from the holder portion 617, or insert the Plug-in UICC 650 or the Mini-UICC 660 into a vacant place in the holder portion 617. The user can transform the removable memory module holder 610 from the first open position to the second open position by sliding the hinge 640 along the slide rail 612 until the hinge 640 substantially reaches the second end 613. The user can transform the removable memory module holder 610 from the first open position to the second open position by sliding the hinge 640 along the slide rail 612 until the hinge 640 substantially reaches the second end 613.

Figure 6C:
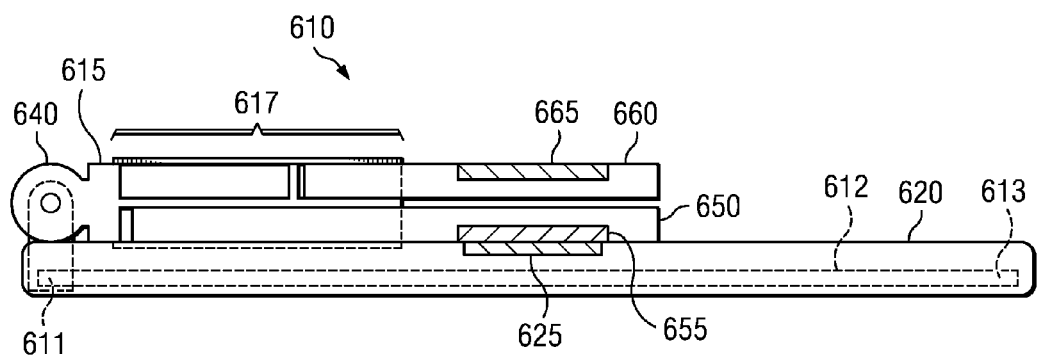
FIG. 6*c* is a diagram illustrating a cross-sectional view of a first closed position of a removable memory module holder comprising a slide rail, according to an example embodiment of the invention.

FIG. 6c is a diagram illustrating a cross-sectional view of a first closed position of a removable memory module holder 610 of FIG. 6a or 6b comprising a slide rail 612 of FIG. 6a or 6b, according to an example embodiment of the invention. The removable memory module holder 610 comprises a first part 615 of FIGS. 6a and 6b and a second part 620 of FIGS. 6a and 6b. The second part 620 comprises conductive terminals 625 of FIGS. 6a and 6b. The first part 615 and the second part 620 are movably connected with a hinge 640 of FIGS. 6a and 6b. The slide rail 612 has a first end 611 of FIGS. 6a and 6b and a second end 613 of FIGS. 6a and 6b. In an embodiment, the hinge 640 is configured to be movable along the slide rail 612. In the first closed position of FIG. 6c, the hinge 640 is at or proximate to the first end 611.

In an embodiment, the first part 615 comprises a holder portion 617 of FIGS. 6a and 6b configured to receive a Plug-in UICC 650 of FIG. 6a comprising first electrical contacts 655 FIG. 6a, and a Mini-UICC 660 of FIG. 6b comprising second electrical contacts 665 of FIG. 6b. The first closed position of FIG. 6c is a use position of the Plug-in UICC 650, and a storage position of the Mini-UICC 660. In the first closed position of FIG. 6c, the first electrical contacts 655 are facing and in contact with the conductive terminals 625 and the second electrical contacts 665 are facing away and not in contact with the conductive terminals 625. A user can transform the removable memory module holder 610 from the first open position of FIG. 5a to the first closed position by rotating the first part 615 about the hinge 640 until the first electrical contacts 655 come into contact with the conductive terminals 625.

Figure 6D:
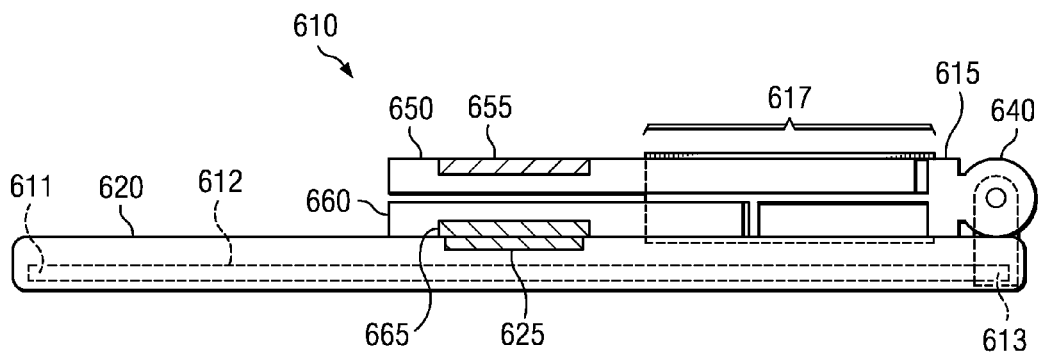
FIG. 6*d* is a diagram illustrating a cross-sectional view of a second closed position of a removable memory module holder comprising a slide rail, according to an example embodiment of the invention.

FIG. 6d is a diagram illustrating a cross-sectional view of a second closed position of a removable memory module holder 610 of FIG. 6a, 6b, or 6c comprising a slide rail 612 of FIG. 6a, 6b, or 6c, according to an example embodiment of the invention. The removable memory module holder 610 comprises a first part 615 of FIGS. 6a, 6b, and 6c and a second part 620 of FIGS. 6a, 6b, and 6c. The second part 620 comprises conductive terminals 625 of FIGS. 6a, 6b, and 6c. The first part 615 and the second part 620 are movably connected with a hinge 640 of FIGS. 6a, 6b, and 6c. The slide rail 612 has a first end 611 of FIGS. 6a, 6b, and 6c and a second end 613 of FIGS. 6a, 6b, and 6c. In an embodiment, the hinge 640 is configured to be movable along the slide rail 612. In the second closed position of FIG. 6d, the hinge 640 is at or proximate to the second end 613.

In an embodiment, the first part 615 comprises a holder portion 617 of FIGS. 6a, 6b, and 6c configured to receive a Plug-in UICC 650 of FIG. 6c comprising first electrical contacts 655 FIG. 6c, and a Mini-UICC 660 of FIG. 6b comprising second electrical contacts 665 of FIG. 6b. The second closed position of FIG. 6d is a use position of the Mini-UICC 660, and a storage position of the Plug-in UICC 650. In the second closed position of FIG. 6d, the second electrical contacts 665 are facing and in contact with the conductive terminals 625 and the first electrical contacts 655 are facing away and not in contact with the conductive terminals 625. A user can transform the removable memory module holder 610 from the first closed position of FIG. 6c to the second closed position of FIG. 6d by rotating the first part about the hinge 640 to the first open position of FIG. 6a, sliding the first part 615 along the rail 612 to the second open position of FIG. 6b, and rotating the first part 615 about the hinge 640 until the first electrical contacts 655 come into contact with the conductive terminals 625.

Figure 7:
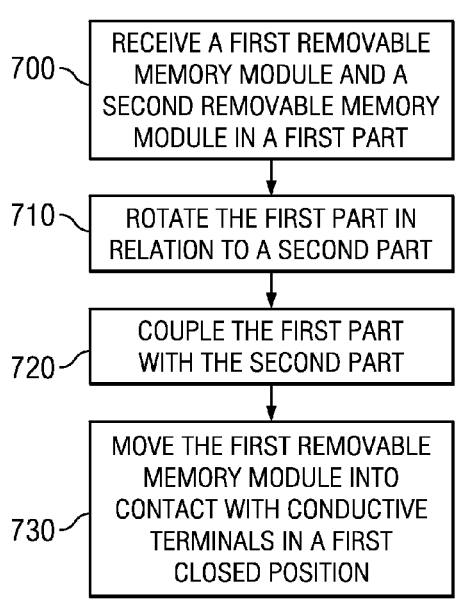
FIG. 7 is a flow diagram illustrating a method relating to a removable memory module holder comprising a first part and a second part, according to an example embodiment of the invention.

FIG. 7 is a flow diagram illustrating a method relating to a removable memory module holder 410 of FIGS. 4a-4e comprising a first part 415 FIGS. 4a-4e and a second part 420 FIGS. 4a-4e, according to an example embodiment of the invention. At 700, a Plug-in UICC 450 of FIG. 4a and a Mini-UICC 460 of FIG. 4b are received in the first part 415. The Plug-in UICC 450 and the Mini-UICC 460 may be received in a holder portion 417 of FIGS. 4a-4e. When the Plug-in UICC 450 and the Mini-UICC 460 are received in the first part 415, the first part 415 may be connected with the second part 420 as in FIGS. 4a and 4b, or detached from the second part 420 as in FIG. 4c.

At 710, the first part 415 is rotated in relation to the second part 420. In order to allow rotation of the first part 415 in relation to the second part 420, the first part 415 is in the detached state of FIG. 4c in such a way that the first part 415 is not connected with the second part 420 and can be moved freely in relation to the second part 420.

At 720, the first part 415 is connected with the second part 420. When the first part 415 and the second part 420 are connected with each other, their relative movement becomes constrained so that they can only move rotably about a hinge 440 of FIGS. 4a-4e.

At 730, the first part 415 is rotated in relation to the second part 420 in order to bring either the first electrical contacts 455 or the second electrical contacts 465 in contact with conductive terminals 425 of FIGS. 4a-4e. A state in which the first electrical contacts 455 are in contact with the conductive terminals 425 is shown in FIG. 4d. A state in which the second electrical contacts 465 are in contact with the conductive terminals 425 is shown in FIG. 4e.

Figure 8:
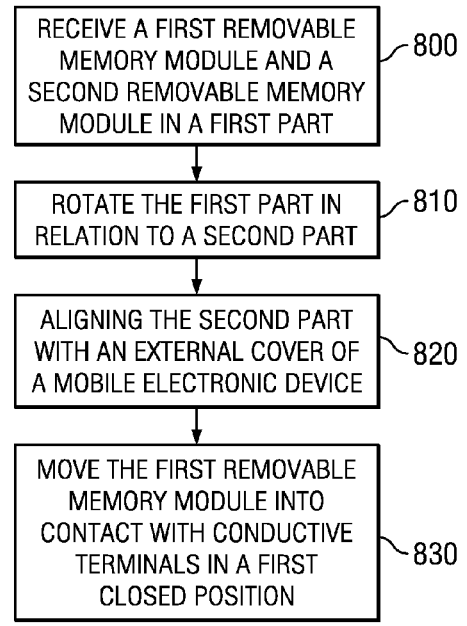
FIG. 8 is a flow diagram illustrating a method relating to a removable memory module holder comprising a part configured to form a portion of an external cover in a mobile electronic device, according to an example embodiment of the invention.

FIG. 8 is a flow diagram illustrating a method relating to a removable memory module holder 510 of FIGS. 5a-5d comprising a cover part 520 of FIGS. 5a-5d, according to an example embodiment of the invention. At 800, a Plug-in UICC 550 of FIGS. 5c and 5d and a Mini-UICC 560 of FIGS. 5c and 5d are received in a first part 515 of FIGS. 5c and 5d. In an embodiment, the method comprises detaching the removable memory module holder 510 from an electronic device 500 of FIGS. 5a and 5b, for example when a user wants to rotate the removable memory module holder 510.

At 810, the removable memory module holder 510 is rotated in relation to the electronic device 500. In order to allow rotation of the removable memory module holder 510 in relation to the electronic device 500, the removable memory module holder 510 is detached from the electronic device 500 in such a way that the removable memory module holder 510 is not connected with the mobile device 500 and can be moved freely in relation to the mobile device 500, as illustrated in FIG. 5b At 820, a cover part 520 of FIGS. 5a-5d is rotated in relation to the first part 515. In an embodiment, the cover part 520 is rotated in such a way that when the removable memory module holder 510 is connected with the electronic device 500, the cover part 520 becomes aligned with an external cover 530 of FIGS. 5a-5d.

At 830, the removable memory module holder 510 is connected with the electronic device 500. In an embodiment, the removable memory module holder 510 is placed inside the electronic device 500 in such a way that only the cover part 520 remains visible from the outside. In an embodiment, the cover part 520 is aligned with the external cover 530.

Figure 9:
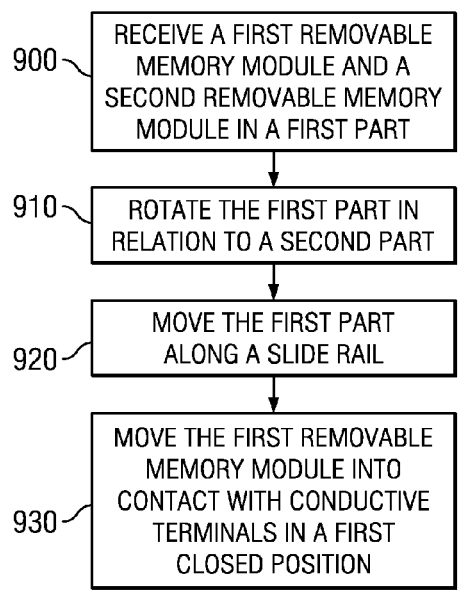
FIG. 9 is a flow diagram illustrating a method relating to a removable memory module holder comprising a slide rail, according to an example embodiment of the invention.

FIG. 9 is a flow diagram illustrating a method relating to a removable memory module holder 600 of FIGS. 6a-6d comprising a slide rail 612 of FIGS. 6a-6d, according to an example embodiment of the invention. The slide rail has a first end 611 of FIGS. 6a-6d and a second end 613 of FIGS. 6a-6d. The removable memory module holder 600 comprises a first part 615 of FIGS. 6a-6d and a second part 620 of FIGS. 6a-6d. The first part 615 and the second part 620 are connected with a hinge 640 of FIGS. 6a-6d. The hinge 640 is slidingly movable along the slide rail 612. At 900, a Plug-in UICC 650 of FIG. 6a and a Mini-UICC 650 of FIG. 6b are received in the first part 615. The removable memory module holder 600 may be in the first open position of FIG. 6a, in which the hinge 640 is at or near the first end 611, or in the second open position of FIG. 6b, in which the hinge 640 is at or near the second end 613. However, the removable memory module holder 600 may be in any suitable intermediate position, in which the hinge 640 is between the first end 611 and the second end 613.

At 610, the first part 615 is translated in relation to the second part 620 by causing the hinge 640 to move along the slide rail 612 toward the first end 611 or the second end 613.

At 620, the first part 615 is rotated about the hinge 640 toward the second part 620. At 630, electrical contacts 655 of FIG. 6a in the Plug-in UICC 650 are brought into contact with conductive terminals 625 of FIGS. 6a-6d, or electrical contacts 665 of FIG. 6b in the Mini-UICC 650 are brought into contact with conductive terminals 625. A state in which the first electrical contacts 465 are in contact with the conductive terminals 625 is shown in FIG. 6c. A state in which the second electrical contacts 665 are in contact with the conductive terminals 625 is shown in FIG. 6d.

Without in any way limiting the scope, interpretation, or application of the claims appearing below, a technical effect of one or more of the example embodiments disclosed herein is that a UICC holder capable of supporting two different UICC formats is provided. Another technical effect of one or more of the example embodiments disclosed herein is that a compact UICC holder is provided. Another technical effect of one or more of the example embodiments disclosed herein is that a user can easily switch between different UICCs installed in a device. Another technical effect of one or more of the example embodiments disclosed herein is that a separate adapter is not needed to accommodate UICCs of different formats in a device. Another technical effect of one or more of the example embodiments disclosed herein is that a device with a smooth exterior surface is provided.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus, comprising:
a first part configured to receive a first and second removable memory module;
a second part coupled with the first part with a hinge; and
conductive terminals configured to contact the first removable memory module in a first closed position and the second removable memory module in a second closed position;
wherein the second part comprises the conductive terminals;
wherein the second part comprises a slide rail, and at least part of the hinge is movable along the slide rail; and
wherein the slide rail comprises a first end and a second end, and the hinge is configured to be at the first end when the hinge is in the first closed position, and the hinge is configured to be at the second end when the hinge is in the second closed position.

2. An apparatus according to claim 1, wherein the first part is detachable from the second part.

3. An apparatus according to claim 2, wherein the hinge is a snap hinge.

4. An apparatus according to claim 1, wherein at least one of the first and second part is a cover part configured to form a portion of an external cover in an electronic device.

5. An apparatus according to claim 4, wherein at least one of the first and second part is configured to align with the external cover.

6. An apparatus according to claim 4, configured to have an open position in which the conductive terminals are not contacting any of the first or the second removable memory modules.

7. An apparatus according to claim 1, wherein the first and second removable memory modules are of different formats.

8. An apparatus according to claim 1, wherein the first and second removable memory modules are universal integrated circuit cards.

9. An apparatus according to claim 8, wherein the second removable memory module has smaller length and smaller width than the first removable memory module.

10. An apparatus according to claim 1, wherein the first closed position is a use position of the first removable memory module and a storage position of the second removable memory module.

11. An apparatus according to claim 1, configured to receive the first and second removable memory modules such that a major surface of the first removable memory module is facing a major surface of the second removable memory module.

12. An apparatus according to claim 11, wherein the first and second removable memory modules comprise electric contacts, wherein the first part is configured to receive the first and second removable memory modules in such a way that the electric contacts in the first and second removable memory modules are facing away from each other.

13. An apparatus according to claim 1, wherein the first part comprises first and second portions, wherein the first portion is moveably coupled with the second portion.

14. An apparatus according to claim 13, wherein the first portion is rotably coupled with the second portion.

15. An apparatus according to claim 1, wherein an electronic device comprises the apparatus.

16. A method, comprising:
receiving a first and second removable memory module in a first part;
rotating the first part in relation to a second part about a hinge movable along a slide rail;
moving the first removable memory module along the slide rail to the hinge and into contact with conductive terminals in a first closed position; and
moving the second removable memory module along the slide rail to the hinge and into contact with the conductive terminals in a second closed position.

17. A method according to claim 16, wherein moving the first part in relation to the second part comprises a sliding movement.

18. A method according to claim 16, wherein moving the first part in relation to the second part comprises detatching at least part of the first part.

19. A method according to claim 16, the method comprising coupling the first part with the second part.

20. A method according to claim 16, the method comprising aligning at least one of the first and second part with an external cover of an electronic device.

\* \* \* \* \*